United States Patent
Ee

(10) Patent No.: US 10,134,431 B2
(45) Date of Patent: Nov. 20, 2018

(54) MULTI-LAYER SHEAR MODE PZT MICROACTUATOR FOR A DISK DRIVE SUSPENSION, AND METHOD OF MANUFACTURING SAME

(71) Applicant: Magnecomp Corporation, Murrieta, CA (US)

(72) Inventor: Kuen Chee Ee, Chino, CA (US)

(73) Assignee: Magnecomp Corporation, Murrieta, CA (US)

( * ) Notice: Subject to any disclaimer, the term of this patent is extended or adjusted under 35 U.S.C. 154(b) by 0 days.

(21) Appl. No.: 15/496,607

(22) Filed: Apr. 25, 2017

(65) Prior Publication Data

US 2017/0316797 A1    Nov. 2, 2017

Related U.S. Application Data

(60) Provisional application No. 62/328,360, filed on Apr. 27, 2016.

(51) Int. Cl.
| | | |
|---|---|---|
| *G11B 5/48* | (2006.01) | |
| *H01L 41/083* | (2006.01) | |
| *H01L 41/09* | (2006.01) | |
| *H01L 41/277* | (2013.01) | |

(52) U.S. Cl.
CPC .......... *G11B 5/483* (2015.09); *H01L 41/083* (2013.01); *H01L 41/0933* (2013.01); *H01L 41/277* (2013.01)

(58) Field of Classification Search
None
See application file for complete search history.

(56) References Cited

U.S. PATENT DOCUMENTS

| | | | | |
|---|---|---|---|---|
| 7,126,782 B2 * | 10/2006 | Koganezawa | ....... | G11B 5/4833 360/75 |
| 7,433,159 B2 | 10/2008 | Yao et al. | | |
| 8,085,508 B2 | 12/2011 | Hatch | | |
| 8,125,741 B2 * | 2/2012 | Shelor | .................. | G11B 5/4826 360/294.4 |
| 8,767,355 B2 * | 7/2014 | Zhang | ................. | H01L 41/0993 360/294.4 |
| 8,879,210 B1 * | 11/2014 | Hahn | .................. | G11B 5/4873 360/245.3 |
| 9,129,624 B1 | 9/2015 | Hahn et al. | | |
| 2001/0038515 A1 * | 11/2001 | Koganezawa | ....... | G11B 5/5552 360/294.4 |

(Continued)

OTHER PUBLICATIONS

Koganezawa, Shinji et al., Development of Shear-Mode Piezoelectric Microactuator for Precise Head Positioning, Dec. 2001, Fujitsu Sci. Tech. J. 37, 2, pp. 212-219.

(Continued)

*Primary Examiner* — William J Klimowicz
(74) *Attorney, Agent, or Firm* — Nixon Peabody LLP

(57) ABSTRACT

A microactuator for a suspension is described. The microactuator includes a multi-layer PZT device having a first face and an opposite second face. Each layer of the multi-layer PZT device is configured to operate in its d15 mode when actuated by an actuation voltage. The layers are configured as a stack such that each layer is configured to act in the same direction when actuated such that the first face moves in shear relative to the second face.

18 Claims, 5 Drawing Sheets

(56) References Cited

U.S. PATENT DOCUMENTS

| | | | | |
|---|---|---|---|---|
| 2002/0191327 A1* | 12/2002 | Hawwa | ............... | G11B 5/4853 |
| | | | | 360/77.07 |
| 2004/0061969 A1* | 4/2004 | Yang | ................... | G11B 5/4826 |
| | | | | 360/78.05 |
| 2004/0125511 A1* | 7/2004 | Yang | ................... | G11B 5/5552 |
| | | | | 360/294.4 |
| 2009/0021857 A1* | 1/2009 | Shelor | ................. | G11B 5/4826 |
| | | | | 360/77.16 |
| 2009/0080119 A1* | 3/2009 | Kurihara | ............. | G11B 5/6005 |
| | | | | 360/313 |
| 2009/0195938 A1* | 8/2009 | Yao | ...................... | G11B 5/4826 |
| | | | | 360/294.4 |
| 2009/0219653 A1* | 9/2009 | Aoki | ................... | G11B 5/5552 |
| | | | | 360/294.4 |
| 2009/0237841 A1* | 9/2009 | Kurihara | ............. | G11B 5/4826 |
| | | | | 360/235.4 |
| 2013/0188282 A1* | 7/2013 | Zhang | ................ | H01L 41/0993 |
| | | | | 360/234.3 |
| 2016/0093792 A1* | 3/2016 | Xiong | ................ | H01L 41/0815 |
| | | | | 360/294.4 |
| 2016/0267929 A1* | 9/2016 | Someya | .............. | G11B 5/4833 |

OTHER PUBLICATIONS

Lengert, David et al., Design of Suspension-Based and Collocated Dual Stage Actuated Suspension, Jul. 3, 2012, Microsyst. Technol. 18:1615-1622, Springer-Verlag online.

Web page entitled "Shear Actuators," PI Ceramic GmbH, Lederhose, Germany, http://www.piceramic.com/piezo-technology/properties-piezo-actuators/displacement-modes.html retrieved Jul. 20, 2015.

* cited by examiner

MULTI-LAYER SHEAR MODE PZT MICROACTUATOR FOR A DISK DRIVE SUSPENSION, AND METHOD OF MANUFACTURING SAME

CROSS-REFERENCE TO RELATED APPLICATIONS

This application claims the benefit of U.S. Provisional Application No. 62/328,360 filed on Apr. 27, 2016, which is hereby incorporated by reference in its entirety.

FIELD

Embodiments of the invention relate to the field of suspensions for disk drives. More particularly, this invention relates to the field of a multi-layer shear mode PZT microactuator for a disk drive suspension, and a method of manufacturing the microactuator.

BACKGROUND

Magnetic hard disk drives and other types of spinning media drives such as optical disk drives are well known. In a typical hard disk drive, the part that holds the read/write head over the correct data track on the spinning data disk, is called the suspension. The suspension typically includes a base or baseplate that is affixed to an actuator arm, a spring portion or simply a "spring" attached to the base, and a beam portion or load beam attached at the end of the spring. The beam portion has a flexure attached to it. The flexure typically has a stainless steel metal support layer, an insulating layer such as polyimide, and a conductive layer made of copper or copper alloy. The insulating layer and the conductive layer form circuitry on the metal support layer. The flexure has a fixed portion that is fixed to the load beam such as by laser spot welding, and a gimbaled portion or simply a gimbal. The gimbal holds the head slider which contains the read/write data transducers, and allows that head slider to pitch and roll freely as the data disk moves underneath the head slider which allows for slight irregularities in the data disk surface and for vibrations in the disk. The slider is maintained at the correct height over the spinning disk platter via an air bearing created by the wind due to the spinning disk.

In a dual stage actuated (DSA) suspension, in addition to the voice coil motor which moves the entire suspension, an actuator located somewhere on the suspension effects fine movements of the head slider for fast, accurate positioning of the head slider. DSA suspensions have been proposed that mount one actuator, or usually two piezoelectric actuators acting in push-pull fashion, on the base plate, on the load beam, or on or acting directly on the gimbaled portion of the flexure. Such actuators are sometimes called milliactuators, or microactuators especially if the actuators are located on, or act directly on, the gimbal. Suspension designs in which a microactuator is mounted on the gimbal, or acts directly on the gimbal, are sometimes called gimbal actuated suspensions, or GSA suspensions.

Piezoelectric devices are often made of lead zirconate titanate (PZT), although other materials exhibit piezoelectric properties and are sometimes used to make piezoelectric devices. The term "PZT" is often used as shorthand to refer generally to piezoelectric devices. That shorthand terminology will be used herein, it being understood that a "PZT" device need not be strictly made of lead zirconate titanate.

U.S. Pat. No. 9,129,624 issued to Hahn et al. and assigned to the assignee of the present application, discloses a GSA suspension having PZT microactuators that extend from a relatively fixed part of the flexure to the head gimbal, i.e. to the gimbaled portion of the flexure, through flexible ribbon-like connectors. That patent is hereby incorporated by reference in its entirety for the flexure structure including the connections between the piezoelectric microactuators and the gimbal.

As the demand continues for ever greater track densities and read/write speeds, a need remains for lighter, faster, and more responsive DSA suspension designs.

SUMMARY

A microactuator for a suspension is described. The microactuator includes a multi-layer PZT device having a first face and an opposite second face. Each layer of the multi-layer PZT device is configured to operate in its d15 mode when actuated by an actuation voltage. The layers are configured as a stack such that each layer is configured to act in the same direction when actuated such that the first face moves in shear relative to the second face.

Other features and advantages of embodiments of the present invention will be apparent from the accompanying drawings and from the detailed description that follows.

BRIEF DESCRIPTION OF THE DRAWINGS

Embodiments of the present invention are illustrated by way of example and not limitation in the figures of the accompanying drawings, in which like references indicate similar elements and in which.

DETAILED DESCRIPTION

Figure 1:
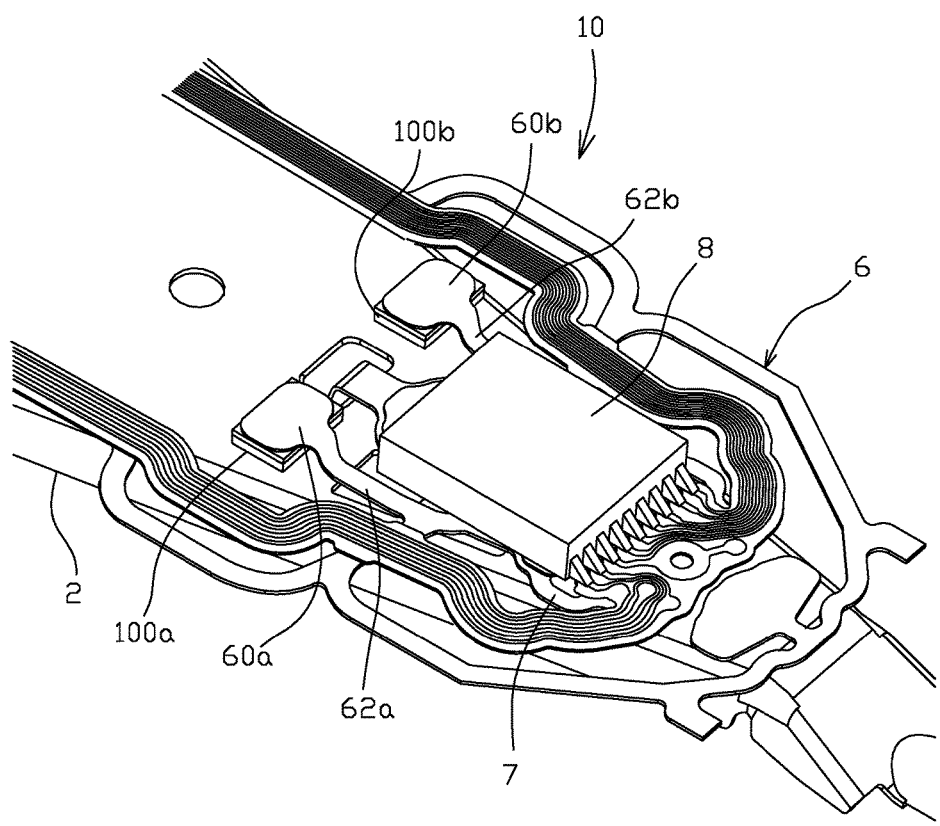
FIG. 1 is an oblique top view of the distal end of a disk drive suspension employing two multi-layer shear mode PZT devices according to an embodiment of the invention.

The PZTs shown in U.S. Pat. No. 9,129,624 issued to Hahn et al. employ the d31 piezoelectric coefficient of the PZT material. That is, they operated in the d31 mode of operation, in which the expansion or contraction of the device is in a direction perpendicular to the direction of the applied electric field. It is known that the d15 shear-mode piezoelectric coefficient is greater than the d31 coefficient, and thus at least in theory a PZT operating in the d15 mode could exhibit greater stroke length per unit input of actuation voltage. Difficulties arise in manufacturing such a device including poling the device. Multi-layer PZTs operating in the d15 mode have been suggested, but present even greater difficulties in manufacturing those devices including poling them. U.S. Patent Application No. 2004/0061969 mentions a multi-layer shear mode PZT, but does not disclose a manufacturing process.

Embodiments of present invention is of a multi-layer shear mode PZT actuator operating in the d15 mode, a suspension employing such a device, and a method of manufacturing such a multi-layer shear mode PZT device.

In the suspension, two multi-layer shear mode PZT microactuators operating in their d15 modes are mounted to a relatively fixed portion of the suspension, and act on the gimbaled portion of a suspension where the head slider is mounted through thin, flexible ribbon-like connectors. The PZT microactuators are mounted such that they are separated horizontally from the head slider in either the lateral and/or longitudinal direction. They are not collocated with the head slider, meaning that they are not vertically stacked with the head slider.

According to an exemplary manufacturing process, in which the numbers below correspond to FIGS. 4A-4F.

4A Make a multi-layer PZT, with the successive layers having alternatingly offset electrodes that do not extend to the ends of the device.

4B Apply end electrodes on the ends of alternating PZT layers which will be called the odd PZT layers, and pole those odd layers in the x-direction.

4C Grind or cut off the electrodes on the odd PZT layers.

4D Apply end electrodes on the ends of the even PZT layers, and pole those even layers in the x-direction.

4E Grind or cut off the electrodes on the even PZT layers. Grind or cut all the way down until the following electrodes are exposed at the ends:
  the electrodes over the odd layers are exposed on the left side of the device, and
  the electrodes over the even layers are exposed on the right side of the device.

4F Apply side electrodes to form interleaving comb electrodes, i.e.:
  the left side electrode is attached to the electrodes over the odd PZT layers, and
  the right side electrode is attached to the electrodes over the even PZT layers.

The electrodes can be applied as in steps 4B and 4D by depositing thin layers of metal, such as by sputtering, chemical vapor deposition (CVD), and/or electrodeposition. The sputtering may be of a seed layer, followed by another deposition step such as electrodeposition. A poling voltage is then operatively connected to those electrodes in order to pole the device.

Alternatively, instead of depositing metal layers to form the end electrodes, external metal electrodes may be simply pressed up against the ends of selected ones of the PZT layers, and then a voltage differential applied across those electrodes in order to pole the associated PZT layers located between the electrodes. For example, a comb-like device having a number of metal fingers extending therefrom could be pressed up against the ends of the odd PZT layers, and then a voltage applied which poles the odd PZT layers in a positive x direction. The fingers are then moved from the odd layers to the even layers, and an opposite voltage is applied which poles the even layers in a negative x direction.

Regardless of whether the electrodes used in the poling process are deposited or merely momentarily pressed up against the ends of the PZT layers, the result after poling is a multi-layer PZT device that has interleaved layers that are alternatingly poled in the positive x direction and in the negative x direction.

Exemplary embodiments of the invention will be further described below with reference to the drawings, in which like numbers refer to like parts. The drawing figures might not be to scale, and certain components may be shown in generalized or schematic form and identified by commercial designations in the interest of clarity and conciseness.

FIG. 1 is an oblique top view of the distal end of a disk drive suspension 10 employing two multi-layer shear mode PZT devices 100a,b according to an embodiment of the invention. Suspension 10 includes load beam 2, flexure 6, and head slider 8 carrying a read/write magnetic transducers. Electrical connections to PZT devices 100a,b are omitted for clarity of illustration. The bottom sides of the PZT devices 100 are affixed to a portion of the load beam 2, and each of the top sides of PZT devices 100a,b are affixed to a corresponding contact pads 60a,b, each of which are operatively connected to the gimbaled portion of the flexure 6 by connectors 62a,b. For various embodiments, connectors 62a,b are thin, flexible ribbon-like connectors. The mechanical structure of such a suspension is described more fully in U.S. Pat. No. 9,129,624 to Hahn et al., which is assigned to the assignee of the present application, and which is incorporated by reference herein.

According to various embodiments each of the PZT devices 100a,b are configured to move in shear. When PZT devices 100a,b are actuated, both PZT devices 100a,b move in shear, with the top surface or face of one device moving in a more distal direction, and the top surface or face of the other device moving in a more proximal direction. The two PZT devices thus work in tandem in push-pull fashion. Head slider 8 which is mounted on the gimbal 7 is thus rotated by the actions of the PZT devices. This rotation causes the read/write transducers (not separately shown) which are embedded within head slider 8 to move radially across the surface of the spinning magnetic media data disk (not shown) to precisely position those transducers over the desired data track.

Figure 2:
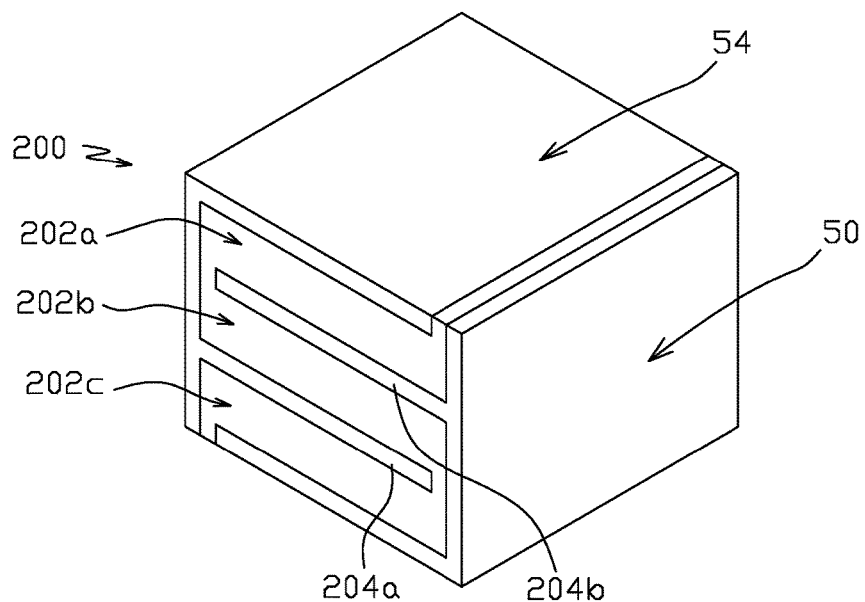
FIG. 2 is perspective view of a multi-layer shear mode PZT according to an embodiment of the invention.

FIG. 2 is perspective view of a multi-layer shear mode PZT device 200 according to an embodiment of the invention. The PZT device 200 includes negative electrode 50, positive electrode 54, and a plurality of PZT layers 202a,b,c, with fingers 204a,b of the electrodes extending between PZT layers 202a,b,c, and with fingers of the negative and positive electrodes being interleaved in comb fashion.

Figure 3:
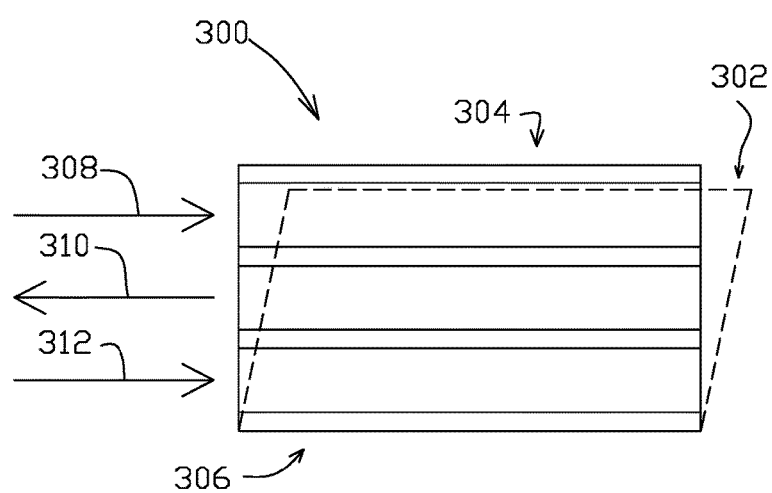
FIG. 3 is a side elevation view of the multi-layer shear mode PZT of the invention, with dashed lines showing the shear mode deformation of the device when actuated.

FIG. 3 is a side elevation view of a multi-layer shear mode PZT device 300 according to the illustrative embodiment, with dashed lines 302 showing the shear mode deformation of the device when actuated.

FIGS. 4A-4F constitute a process flow diagram showing an illustrative first manufacturing method of producing a PZT device, according to various embodiments, showing side sectional views of the inchoate device 20 as it is processed.

Figure 4A:
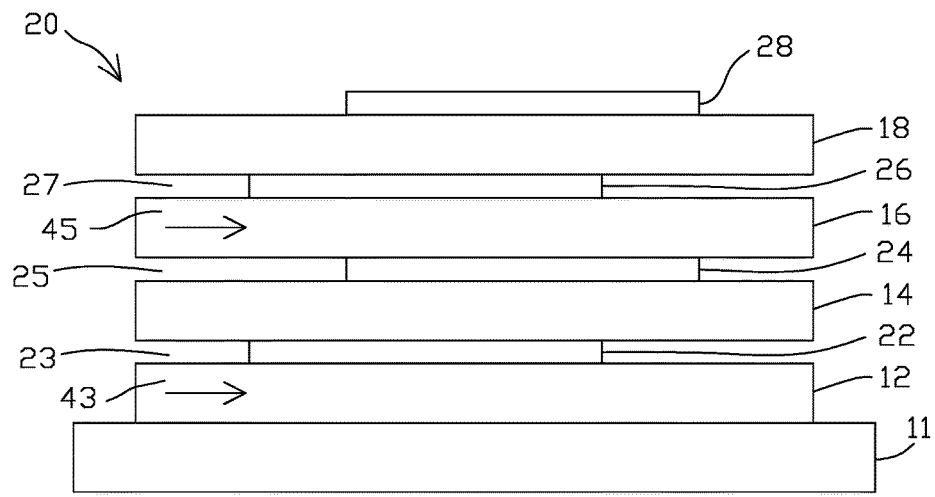
FIGS. 4A-4F constitute a process flow diagram showing a first manufacturing method of producing the device of FIG. 2, showing side sectional views of the inchoate device as it is processed.

In FIG. 4A, a multi-layer PZT device has been formed using an additive process on a substrate 11 such as a Kapton® carrying tape, resulting in a number of layers 12/14/16/18 of PZT material stacked on top of each other to form a stack using techniques including those known in the art. Some embodiments of a PZT device include at least four layers of PZT material. Layers of conductive material 22/24/26/28, typically a deposited metal, are respectively disposed over each PZT material layer. According to various embodiments, the deposited metal layers will eventually become part of the electrodes of the device. For clarity of illustration the interstices 23/25/27 between PZT material layers 22/24/26/28 are shown as being unfilled. According to some embodiments, the interstices will generally be filled with a PZT material at the same time as the PZT material layers 22/24/26/28 are deposited. Showing those layers as unfilled helps to clarify the different layers of the device. An unfinished multi-layer stack such as the one shown in FIG. 4A will generally be referred to as an inchoate PZT device 20.

For discussion purposes, referring to the inchoate device 20 as illustrated in FIG. 4A, the first PZT layer 12 from the bottom of the figure and the third PZT layer 16 from the bottom of the figure will be referred to as the odd PZT layers, and the second PZT layer 14 from the bottom of the figure and the fourth PZT layer 18 from the bottom of the figure will be referred to as the even PZT layers.

Conductive layers 22/24/26 are disposed between adjacent piezoelectric layers with conductive layer 28 formed on PZT layer 18 as illustrated in FIG. 4A disposed over PZT layer 18. For example, conductive layer 22 is disposed between adjacent conductive piezoelectric layers 12 and 14. According to some embodiments, less than all of the conductive layers 22/24/26/28 extend to the sides of inchoate device 20. In particular, in the embodiment illustrated in FIGS. 4A-F none of the conductive layers 22/24/26/28 extend to the side of the device.

Figure 4B:
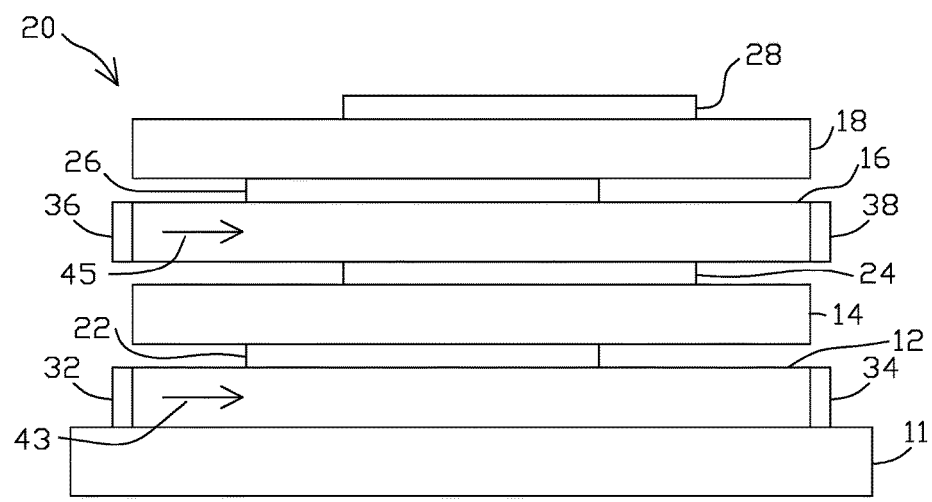

In FIG. 4B, side end electrodes 32 and 34 have been added to the first PZT layer 12, and side end electrodes 36, 38 have been added to the third PZT layer 16. Those end electrodes 32/34/36/38 may be applied for example by masking and sputtering. The side end electrodes 32/34 and 36/38 are used to pole the inchoate device 20, by applying a poling voltage across each electrode pair 32/34 and 36/38 to create an electric field in the positive x-direction, as indicated by positive poling-direction arrows 43 and 45, sufficient to pole the PZT material.

Alternatively, instead of forming side end electrodes 32/34 and 36/38 on ends of odd PZT layers 12/16, conductive fingers could be pressed up against the side ends of those layers, and a poling voltage applied to the conductive fingers in order to induce the electric field that poles those layers.

Figure 4C:
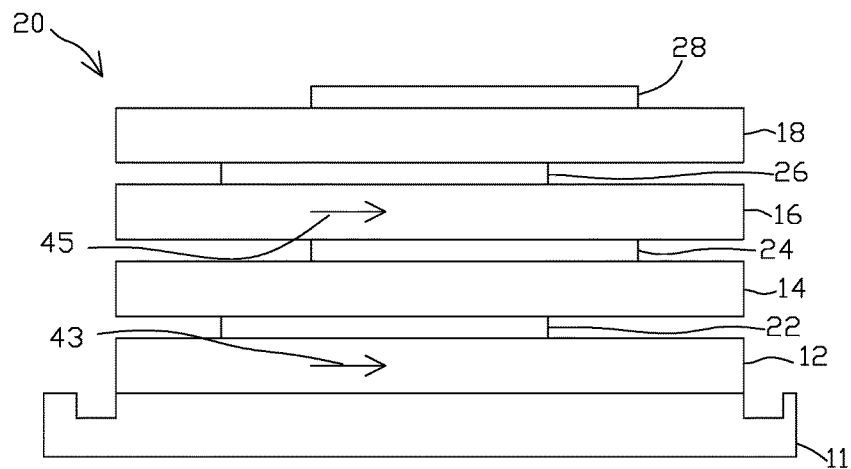

In FIG. 4C side end electrodes 32/34 and 36/38 have been removed using techniques including those known in the art, such as by cutting (dicing) or ablating such as by grinding or laser ablating.

Figure 4D:
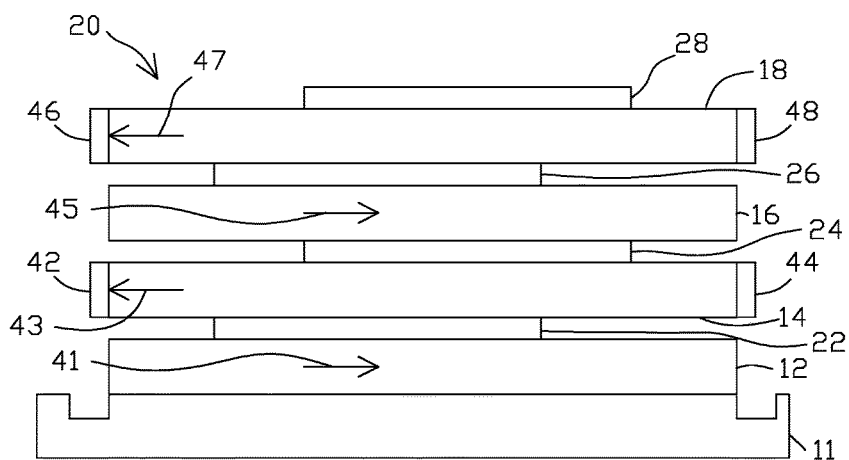

In FIG. 4D side end electrodes 42/44 and 46/48 are added to the even PZT layers, and those even layers are poled in the opposite directions as were the odd PZT layers 12/16.

Figure 4E:
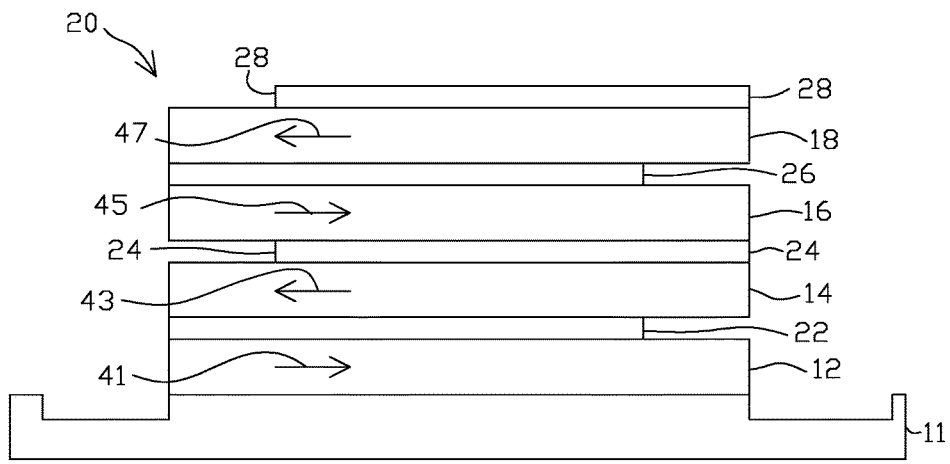

In FIG. 4E the ends of the device are sawed, ground, or otherwise ablated so that all of the PZT layers 12/14/16/18 are coextensive. As shown, this step removes the side end electrodes 42/44 and 46/48 that had been added to the ends of the associated PZT layers 12/14/16/18; however, it is not strictly necessary that those electrodes be either completely or fully removed.

Figure 4F:
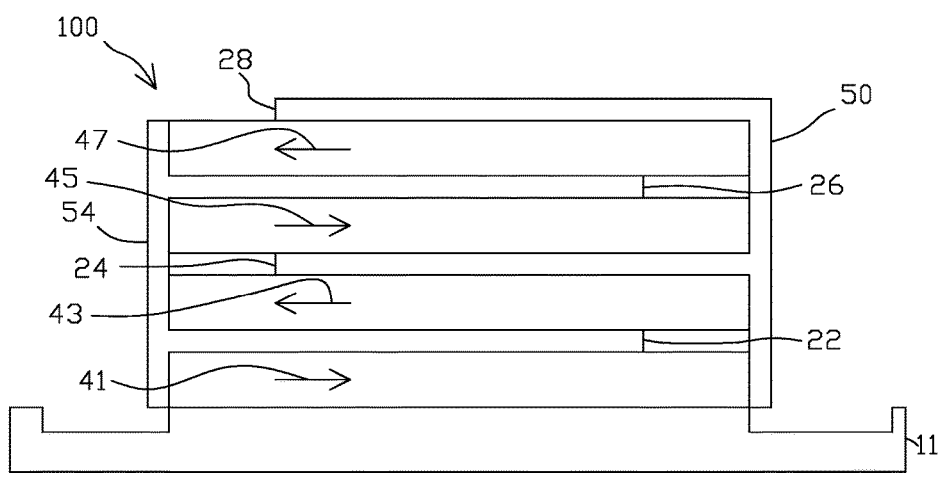

In FIG. 4F electrodes have been applied to the ends of the device so as to make electrical contact with the respective conductive layers. More particularly, a first electrode 50, which will be called the negative (−) electrode, includes conductive layers 24 and 28 that are now electrically ganged together by the additional deposited metal, using techniques including those known in the art, on the right side of the device. Additionally, a second electrode 54, which will be called the positive (+) electrode, includes conductive layers 22 and 26 that are now electrically ganged together by the additional deposited metal on the left side of the device. With the addition of the first electrode 50 and the second electrode 54, the device is now a complete PZT device 100. According to various embodiments, the substrate 11 is removed from the complete PZT device 100 using techniques including those known in the art.

Alternative embodiments include disposing electrodes to the face of the device and the back of the device with reference to the device as illustrated in FIG. 4E to form a first electrode 50 and a second electrode 54 respectively instead of the ends of the device as illustrated in FIG. 4F. Specifically, with reference to FIG. 4E and for illustrative purposes, the horizontal of the inchoate device 20 is the x-axis and the y-axis is coming out of the page. The first electrode 50 would be disposed on the face of the inchoate device 20, illustrated in FIG. 4E, and the second electrode would be disposed on the opposite side of the inchoate device along the y-axis, the back of the device (not shown in FIG. 4E), using techniques including those described herein. The inchoate device 20 could be further processed using techniques including those described herein.

An exemplary PZT device 200 is shown in FIG. 2. When an actuation voltage is applied across the electrodes 50 and 54, each of the PZT layers 202$a,b,c$ deforms in shear in its d15 mode. Because the alternating PZT layers are poled in opposite directions, as indicated by poling direction arrows 308, 310, 312 as shown in FIG. 3, and the polarities of the electric fields caused by the actuation voltages applied to the electrodes are in alternatingly opposite directions, each PZT layer 202$a,b,c$ of the device deforms in shear in the same direction. The result is that the overall device deforms in shear as shown by the PZT device 300 in FIG. 3. That is, the top or first face 304 of the device moves in shear relative to the bottom or second face 306 of the device as illustrated by the dashed lines 302 showing the shear mode deformation. Because the d15 piezoelectric coefficient is higher than the d31 piezoelectric coefficient, the horizontal displacement of the top face 304 is expected to be greater than the horizontal displacement for a similarly sized PZT device acting in the traditional d31 mode.

It will be understood that terms such as "top," "bottom," "above," "below," and x-direction, y-direction, and z-direction as used within the specification and the claims herein are terms of convenience that denote the spatial relationships of parts relative to each other rather than to any specific spatial or gravitational orientation. Thus, the terms are intended to encompass an assembly of component parts regardless of whether the assembly is oriented in the particular orientation shown in the drawings and described in the specification, upside down from that orientation, or any other rotational variation.

It will be appreciated that the term "present invention" as used herein should not be construed to mean that only a single invention having a single essential element or group of elements is presented. Similarly, it will also be appreciated that the term "present invention" encompasses a number of separate innovations which can each be considered separate inventions. Although the present invention has thus been described in detail with regard to the preferred embodiments and drawings thereof, it should be apparent to those skilled in the art that various adaptations and modifications of the present invention may be accomplished without departing from the spirit and the scope of the invention. For example, the electrodes need not necessarily be metal layers, but could instead be other conductive materials such as conductive epoxy. Additionally, the process described herein could be used to make a device having two three, four, five, six, or more generally n number of PZT layers, including the exemplary four-layer device illustrated and described herein. Accordingly, it is to be understood that the detailed description and the accompanying drawings as set forth hereinabove are not intended to limit the breadth of the present invention, which should be inferred only from the following claims and their appropriately construed legal equivalents.

What is claimed is:

1. A suspension for a disk drive, the suspension comprising:
   a load beam;
   a flexure supported by the load beam, the flexure including a gimbal configured to have a head slider mounted thereto, the gimbal configured to pitch and roll the head slider as a data disk moves underneath the head slider; and
   at least a first microactuator, the first microactuator including a multi-layer PZT device having a first face and an opposite second face, each layer of the multi-layer PZT device configured to operate in its d15 mode when actuated by an actuation voltage, the layers configured as a stack such that each layer is configured to act in the same direction when actuated such that the first face moves in shear relative to the second face,
   the first face of the multi-layer PZT device is attached to the load beam and the gimbal is operatively connected with the second face of the multi-layer PZT device opposite to the first face.

2. The suspension of claim 1 further comprising at least a second microactuator.

3. The suspension of claim 2, wherein the second microactuator includes a second multi-layer PZT device having a first face of the second multi-layer PZT device and an opposite second face of the second multi-layer PZT device, each layer of the second multi-layer PZT configured to operate in its d15 mode when actuated by an actuation voltage, the layers configured as a second stack such that each layer is configured to act in the same direction when actuated such that the first face of the second multi-layer PZT device moves in shear relative to the second face of the second multi-layer PZT device.

4. The suspension of claim 3, wherein the first face of the second multi-layer PZT device is attached to a portion of the load beam.

5. The suspension of claim 3, wherein the first face of the second multi-layer PZT device is attached to the load beam and the second face of the second multi-layer PZT device is operatively connected with the gimbal, such that when the multi-layer PZT device and the second multi-layer PZT device are actuated the second faces move in shear and in opposite directions thereby rotating the head slider.

6. The suspension of claim 2 wherein the first microactuator and the second microactuator are located on opposite lateral sides of the suspension, and are not stacked vertically with the head slider.

7. The suspension of claim 1, wherein the second face of the multi-layer PZT device is operatively connected with the gimbal, such that when the multi-layer PZT device is actuated the second face is configured to move in shear to move the gimbal.

8. A method of manufacturing a multi-layer shear mode piezoelectric device, comprising:
   forming a stack of a plurality of piezoelectric layers,
   forming a plurality of conductive layers respectively disposed between each pair of piezoelectric layers of the plurality of piezoelectric layers, a first conductive layer on a first outside face of a first piezoelectric layer of the plurality of piezoelectric layers to form at least half of a first face of the multi-layer shear mode piezoelectric device, and a second conductive layer on a second outside face of a second piezoelectric layer of the plurality of piezoelectric layers to form at least half of a second face of the multi-layer shear mode piezoelectric device,
   applying a first electric field in a first direction across a first set of alternating piezoelectric layers of the plurality of piezoelectric layers to pole the first set of alternating piezoelectric layers with a first polarity;
   applying a second electric field in a second direction across a second set of alternating piezoelectric layers of the plurality of piezoelectric layers to pole the second set of alternating piezoelectric layers with a second polarity opposite the first polarity;
   applying conductive material to electrically gang the conductive layers over the first set of alternating piezoelectric layers to create a first electrode; and
   applying conductive material to electrically gang the conductive layers over the second set of alternating piezoelectric layers to create a second electrode, such that applying an electric potential across the first and second electrodes causes the first set of alternating piezoelectric layers and the second set of alternating piezoelectric layers to deform in shear, the movements in shear acting in additive fashion such that overall the piezoelectric device deforms in shear.

9. The method of claim 8, wherein less than all of the conductive layers extend to ends of the plurality of piezoelectric layers.

10. The method of claim 8 further comprising removing material from at least one end of the multi-layer shear mode piezoelectric device such that the plurality of conductive layers formed over the first set of alternating piezoelectric layers are electrically accessible and such that the plurality of conductive layers formed over the second set of alternating piezoelectric layers are electrically accessible.

11. The method of claim 8 further comprising:
    after forming a stack of a plurality of piezoelectric layers and forming a plurality of conductive layers respectively disposed between each pair of piezoelectric layers of the plurality of piezoelectric layers, depositing a first set of side electrodes on ends of the first set of alternating piezoelectric layers; and wherein:
    applying the first electric field includes applying a poling voltage across the first set of side electrodes.

12. The method of claim 11 further comprising:
    removing the first set of end electrodes formed on the first set of alternating piezoelectric layers; and
    depositing a second set of side electrodes on ends of the second set of alternating piezoelectric layers; and
    wherein applying the second electric field includes applying a poling voltage across the second set of side electrodes.

13. The method of claim 11 further comprising:
    after depositing a first set of side electrodes on ends of the first set of alternating piezoelectric layers, removing the first set of side electrodes; and
    after applying a poling voltage across the first set of side electrodes, depositing a second set of side electrodes on ends of the second set of alternating peizoelectric layers; and
    wherein applying the second electric field includes applying a poling voltage across the second set of side electrodes.

14. The method of claim 8 further comprising:
    after step applying a first electric field, depositing side electrodes on ends of the second set of alternating piezoelectric layers, and
    wherein applying the second electric field includes applying a poling voltage across the side electrodes.

15. The method of claim 8 wherein applying the first electric field and the second electric field each includes depositing first and second the electrodes on respective ends of selected ones of the piezoelectric layers; and operatively connecting the side electrodes to a poling voltage thereby poling the selected ones of the plurality of the piezoelectric layers.

16. The method of claim 8 wherein applying the first electric fields and the second electric field each includes pressing first and second electrodes up against respective ends of selected ones of the plurality of the piezoelectric layers; and applying a poling voltage across the first and second electrodes thereby poling the selected ones of the piezoelectric layers.

17. The method of claim 8, wherein the plurality of piezoelectric layers includes at least four piezoelectric layers.

18. A method of manufacturing a multi-layer shear mode piezoelectric device, comprising:

forming an inchoate device comprising a z-direction stack of at least four piezoelectric material layers, the stack including a plurality of conductive layers respectively disposed between adjacent ones of the piezoelectric material layers, a first conductive layer on a first outside face of a first piezoelectric layer of the at least four piezoelectric material layers to form at least half of a first face of the multi-layer shear mode piezoelectric device, and a second conductive layer on a second outside face of a second piezoelectric layer of the at least four piezoelectric material layers to form at least half of a second face of the multi-layer shear mode piezoelectric device;

applying a first electric field in a positive x-direction across a first set of alternating piezoelectric material layers, the first set defining a set of odd layers, so as to pole the odd layers with a first polarity;

applying a second electric field in a negative x-direction across a second set of alternating piezoelectric material layers, the second set defining a set of even layers, so as to pole said even layers with a second polarity opposite the first polarity, the even layers being interleaved with the odd layers;

electrically connecting the conductive layers over the odd layers thereby defining a first electrode; and electrically connecting the conductive layers over the even layers, thereby defining a second electrode;

such that applying an electric potential across the first and second electrodes causes the odd layers and the even layers to deform in shear, the movements in shear acting in additive fashion such that overall the piezoelectric device deforms in shear.

\* \* \* \* \*